(12) United States Patent
Shin

(10) Patent No.: US 7,683,441 B2
(45) Date of Patent: Mar. 23, 2010

(54) SEMICONDUCTOR DEVICE AND METHOD FOR FABRICATING THE SAME

(75) Inventor: Eun Jong Shin, Mapo-gu (KR)

(73) Assignee: Dongbu Hitek Co., Ltd., Seoul (KR)

( * ) Notice: Subject to any disclaimer, the term of this patent is extended or adjusted under 35 U.S.C. 154(b) by 11 days.

(21) Appl. No.: 12/122,487

(22) Filed: May 16, 2008

(65) Prior Publication Data

US 2008/0283937 A1 Nov. 20, 2008

(30) Foreign Application Priority Data

May 17, 2007 (KR) ................. 10-2007-0047981

(51) Int. Cl.
*H01L 29/78* (2006.01)
*H01L 21/336* (2006.01)

(52) U.S. Cl. ........................ 257/410; 438/305

(58) Field of Classification Search ......... 257/288, 257/213, 900, 522, 506, 762, E21.435, 410; 438/197, 142, 319, 411, 421, 305
See application file for complete search history.

(56) References Cited

U.S. PATENT DOCUMENTS 6,104,077 A * 8/2000 Gardner et al. ............ 257/522
6,569,726 B1 * 5/2003 Lee et al. .................. 438/200
2005/0224897 A1 * 10/2005 Chen et al. ................ 257/410
2005/0287823 A1 * 12/2005 Ramachandran et al. ... 438/791

FOREIGN PATENT DOCUMENTS

KR 10-2001-0021476 10/2002
KR 10-2004-0037092 12/2004

* cited by examiner

*Primary Examiner*—Thomas L Dickey
*Assistant Examiner*—Nikolay Yushin
(74) *Attorney, Agent, or Firm*—Saliwanchik, Lloyd & Saliwanchik

(57) ABSTRACT

Provided are a semiconductor device and a method for fabricating the same. The semiconductor device can include a transistor structure, including a gate dielectric on a substrate, a gate electrode on the gate dielectric, a spacer at sidewalls of the gate electrode, and source/drain regions in the substrate; and an interlayer dielectric on the transistor structure where an air gap is provided in a region between the spacer, the interlayer dielectric, and the source/drain region of the substrate.

19 Claims, 6 Drawing Sheets

SEMICONDUCTOR DEVICE AND METHOD FOR FABRICATING THE SAME

CROSS-REFERENCE TO RELATED APPLICATION

The present application claims the benefit under 35 U.S.C. §119 of Korean Patent Application No. 10-2007-0047981, filed May 17, 2007, which is hereby incorporated by reference in its entirety.

BACKGROUND

The demand for improvements of the performance of a transistor is increasing with the acceleration of the integration of a semiconductor device, and the size of a memory cell is decreasing with an increase in the integration degree of a semiconductor device.

However, a parasitic capacitance occurs due to a pre-metal dielectric that fills a gap between a transistor and a gate spacer formed in fabricating the transistor.

A parasitic capacitance is one of the main factors reducing the operation speed of a high-integration device, and the occurrence of a parasitic capacitance greatly affects the characteristics of the device.

Recently, research is being conducted to apply low-dielectric materials to an interlayer dielectric process in order to reduce a delay time caused by such a parasitic capacitance.

BRIEF SUMMARY

Embodiments of the present invention provide a semiconductor device and a method for fabricating the same, which can inhibit an increase in a parasitic capacitance and a decrease in the operation speed of the device.

A semiconductor device according to an embodiment comprises a transistor structure formed on a substrate. The transistor structure can include a gate dielectric disposed on the semiconductor substrate, a gate electrode disposed on the gate dielectric, an LDD region and a source/drain region in the semiconductor substrate, and a spacer on an upper portion of the sidewalls of the gate electrode. An interlayer dielectric can be disposed on the semiconductor substrate, including the gate electrode and the spacers. An air gap can be disposed in a region between the spacers, the semiconductor substrate, and the interlayer dielectric.

A method for fabricating a semiconductor device according to an embodiment can include: forming a gate dielectric and a gate electrode on a semiconductor substrate; forming an LDD region in the semiconductor substrate; forming a spacer on an upper portion of the sidewall of the gate electrode spaced apart from the semiconductor substrate; forming a source and a drain in the semiconductor substrate; and forming an interlayer dielectric on the semiconductor substrate such that an air gap is provided between the spacer, the interlayer dielectric and the semiconductor substrate.

The details of one or more embodiments are set forth in the accompanying drawings and the description below. Other features will be apparent from the description and drawings, and from the claims.

DETAILED DESCRIPTION

Figure 1:
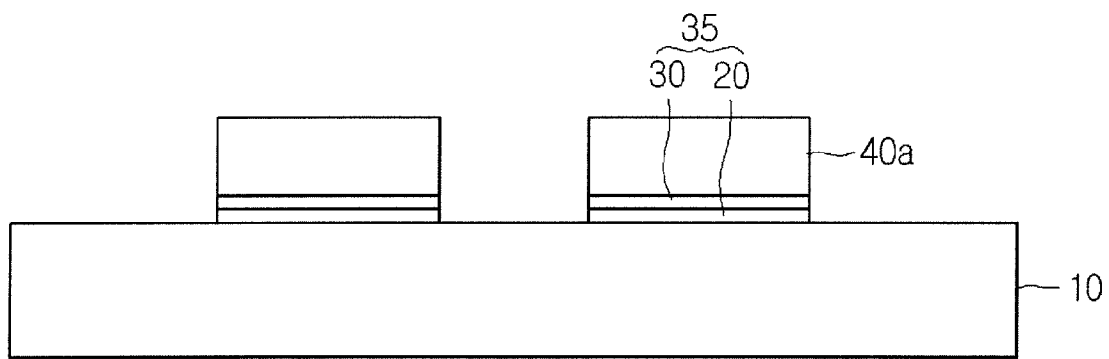
FIGS. 1 to 12 are cross-sectional views illustrating a method for fabricating a semiconductor device according to exemplary embodiments.

Reference will now be made in detail to the embodiments of the present disclosure, examples of which are illustrated in the accompanying drawings.

In the following description, it will be understood that when a layer (or film) is referred to as being 'on/over' another layer or substrate, it can be directly 'on/over' the other layer or substrate, or intervening layers can also be present.

In the drawings, the thicknesses or dimensions of layers and regions are exaggerated for clarity of illustration.

Figure 12:
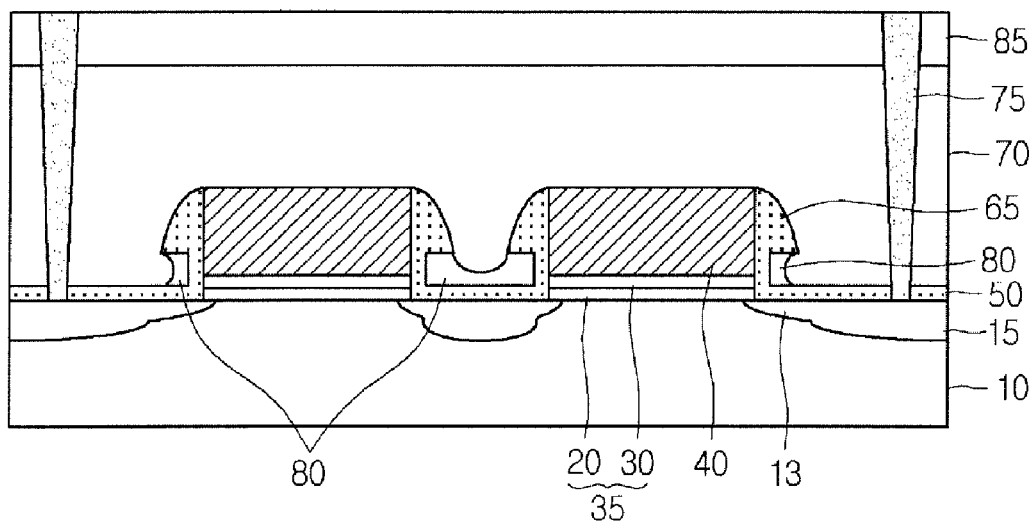

Referring to FIG. 12, a semiconductor device according to an embodiment includes a gate dielectric 35 and a gate electrode 40 stacked on an active region of a semiconductor substrate 10.

A lightly doped drain (LDD) region 13 and a source/drain region 15 can be provided in a region of the semiconductor substrate 10 about the gate. Spacers 65 can be formed at sidewalls of the gate dielectric 35 and the gate electrode 40. In an embodiment, the spacers 65 are formed only at an upper portion of the gate electrode 40.

A silicon nitride (SiN) layer 50 can be provided on a surface of the source/drain region 15 and the gate electrode 40.

The SiN layer 50 can be used to form a shallow source/drain junction. The shallow source/drain junction can be formed through a blanket ion implantation process to penetrate the substrate after passing through the SiN layer 50. By forming a shallow source/drain junction short channel effects can be suppressed.

Although the SiN layer 50 is described as being formed to form a shallow source/drain junction in an exemplary embodiment, embodiments are not limited thereto. In one embodiment, the shallow source/drain junction can be formed selectively.

The gate dielectric 35 can include a stack of a buffer dielectric 20 and a dielectric layer 30 formed of high-dielectric material. The buffer dielectric 20 can be formed of, for example, a silicon oxide layer ($SiO_2$). The high-dielectric material of the dielectric layer 30 can be formed of, for example, hafnium oxide ($HfO_2$).

In an embodiment, the gate electrode 40 can be formed of fully-silicided (FUSI) nickel.

An air gap 80 is provided between the semiconductor substrate 10 and the spacers 65. The air gap 80 can be provided at an underside of the spacer 65.

The formation of the air gap 80 greatly reduces the parasitic capacitance of the semiconductor device, thereby reducing a delay time of the device and also inhibiting a decrease in the operation speed.

The semiconductor device according to embodiments can suppress an increase in the parasitic capacitance. Embodiments can inhibit a decrease in the operation speed of the device. In addition, embodiments can include a shallow source/drain region.

Hereinafter, a method for fabricating a semiconductor device according to exemplary embodiments will be described with reference to FIGS. 1 to 12.

Referring to FIG. 1, in one embodiment, a buffer oxide layer, a dielectric layer, and a gate electrode layer can be sequentially formed on a semiconductor substrate 10. Then, a selective etching process can be performed to form a pattern of a gate electrode 40a and a gate dielectric 35. The gate dielectric 35 can be formed including a buffer oxide pattern 20 and a dielectric pattern 30.

In an embodiment, buffer oxide pattern 20 can be formed of, for example, silicon oxide ($SiO_2$).

The dielectric pattern 30 can be formed of hafnium oxide (HfO$_2$). In one embodiment, the dielectric layer can be formed through atomic layer deposition (ALD).

The gate electrode 40a can be formed of polysilicon, metal, or a stack of polysilicon and metal. For a high speed operating transistor, a polysilicon gate can be converted to a metal gate.

To this end, for example, a polysilicon layer can be deposited and made amorphous. The polysilicon can be made amorphous by implanting ions of, for example, germanium (Ge) (i.e., a Group-IV element) into the polysilicon. Then a silicide process can be performed to convert the gate electrode 40a into a FUSI gate electrode.

Figure 2:
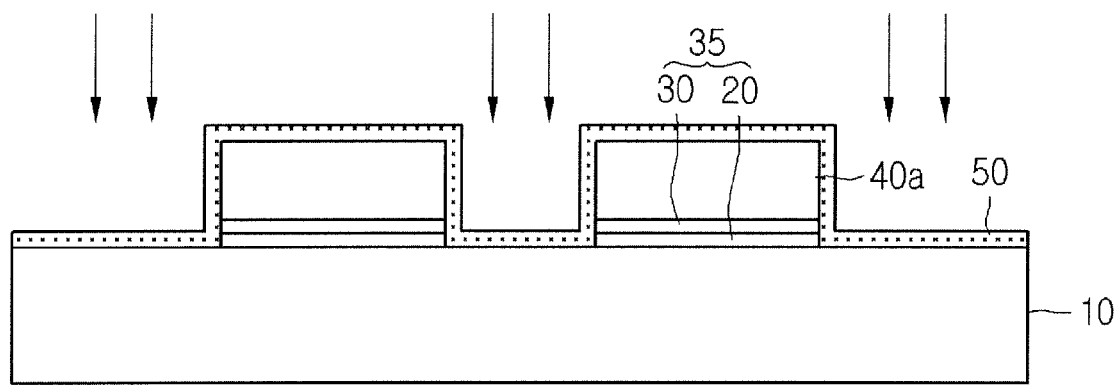

Referring to FIG. 2, a first SiN layer 50 can be formed on the semiconductor substrate 10 on which the gate including the gate dielectric 35 and the gate electrode 40a has been formed.

The first SiN layer 50 can be formed to assist in forming a shallow source/drain junction in a subsequent process. The shallow source/drain junction can be used to suppress short channel effects.

In an embodiment, first SiN layer 50 can be formed through a low-pressure chemical vapor deposition (LPCVD) process. In one embodiment, the SiN layer 50 can be formed to a thickness of about 10 nm.

In certain embodiments, the shallow source/drain junction can be formed selectively.

Figure 3:
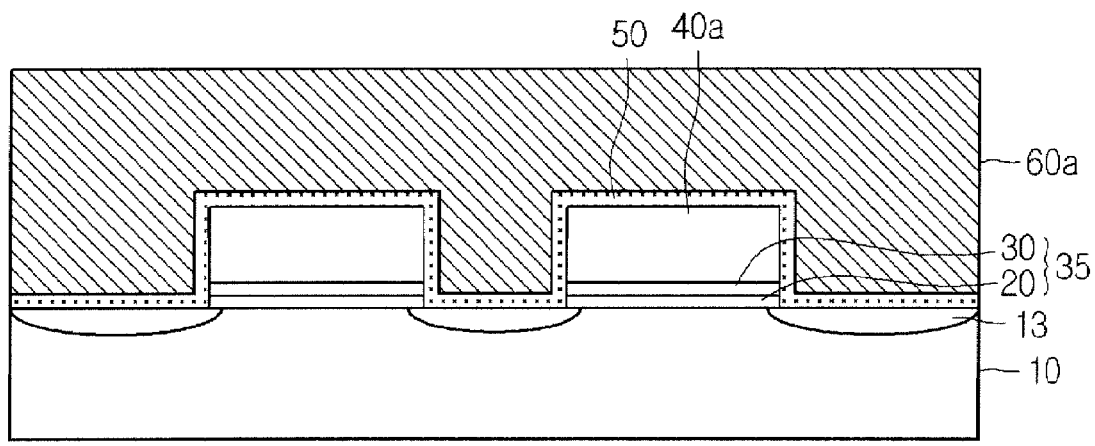

Using the gate as a mask, low-concentration impurities (n-type or p-type impurities) can be ion-implanted into the semiconductor substrate 10 to form a LDD region 13 such as shown in FIG. 3.

Referring to FIG. 3, a first oxide layer 60a can be formed on the semiconductor substrate 10. In an embodiment, the first oxide layer 60a can be formed using a LPCVD process.

Figure 4:
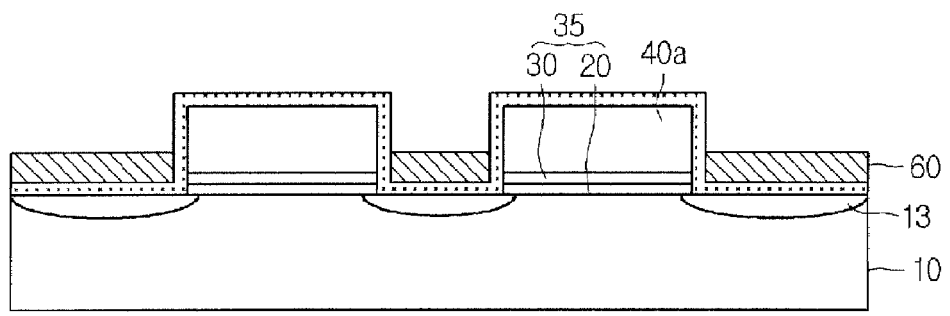

Referring to FIG. 4, the first oxide layer 60a can be etched to form a first oxide pattern 60.

The regions having the first oxide pattern 60 formed therein provide a space for forming an air gap between a spacer and the semiconductor substrate 10. The first oxide pattern 60 will be removed after certain subsequent processes to form the air gap.

Figure 5:
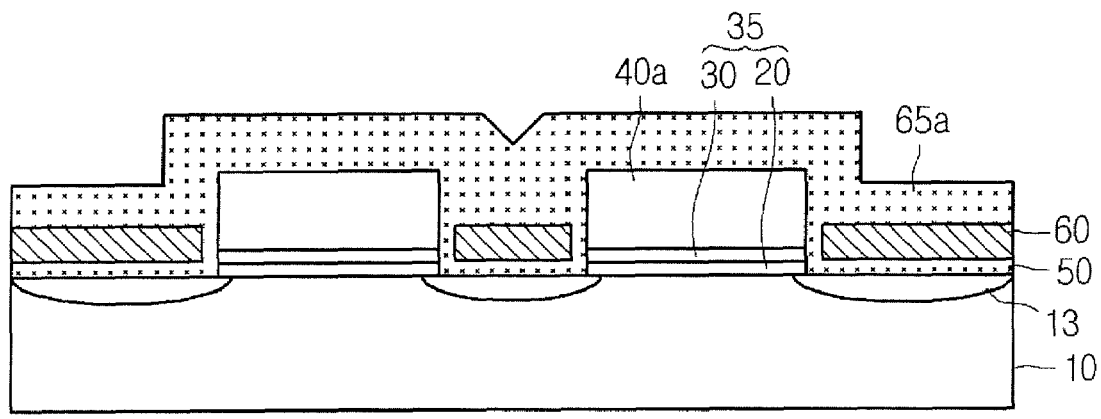

Referring to FIG. 5, a second SiN layer 65a can be formed on the semiconductor substrate 10 including on the first oxide pattern 60.

Figure 6:
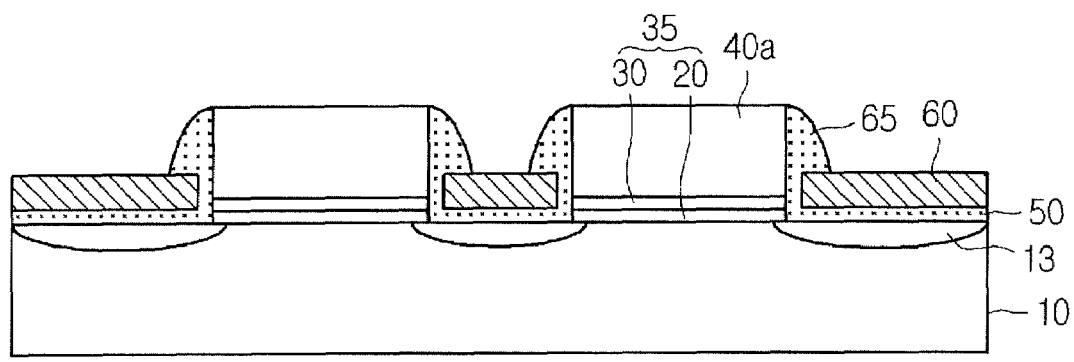

Referring to FIG. 6, the second SiN layer 65a can be anisotropically etched to form self-aligned spacers 65 on sidewalls of the gate electrode 40a on the first SiN layer 65a.

Figure 7:
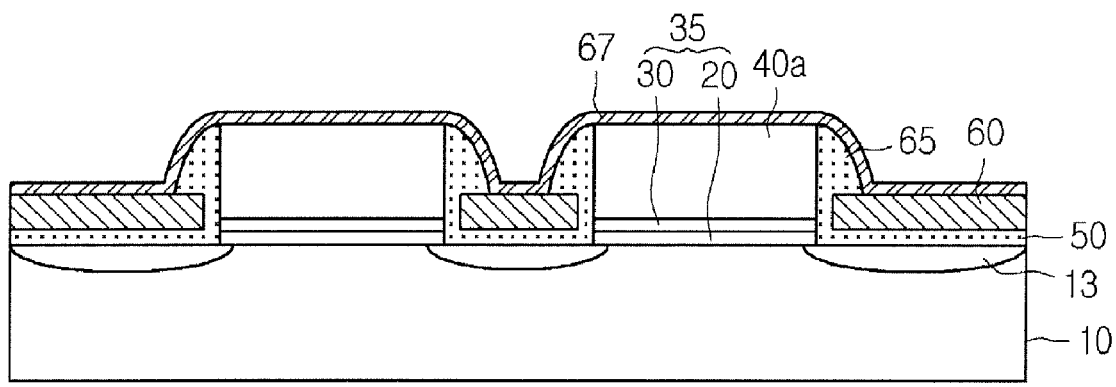

Referring to FIG. 7, a metal layer 67 can be formed on the entire surface of the semiconductor substrate 10. The metal layer 67 is a metal that can be used for forming a silicide. In an exemplary embodiment, the metal layer 67 can be a nickel layer. The metal layer 67 can be formed using, for example, a physical vapor deposition (PVD) process.

Figure 8:
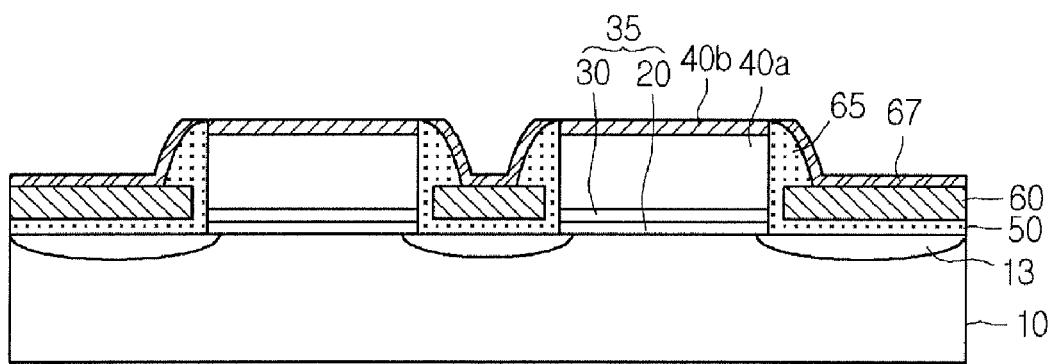

Referring to FIG. 8, a first annealing process can be performed to form a silicide layer 40b. The silicide layer 40b can be, for example, a nickel silicide layer.

The nickel silicide layer 40b can be formed on the gate electrode 40a through formation of a NiSi compound at the contact between the nickel layer 67 and the silicon, making it possible to reduce the contact resistance between the device and the interconnection.

Figure 9:
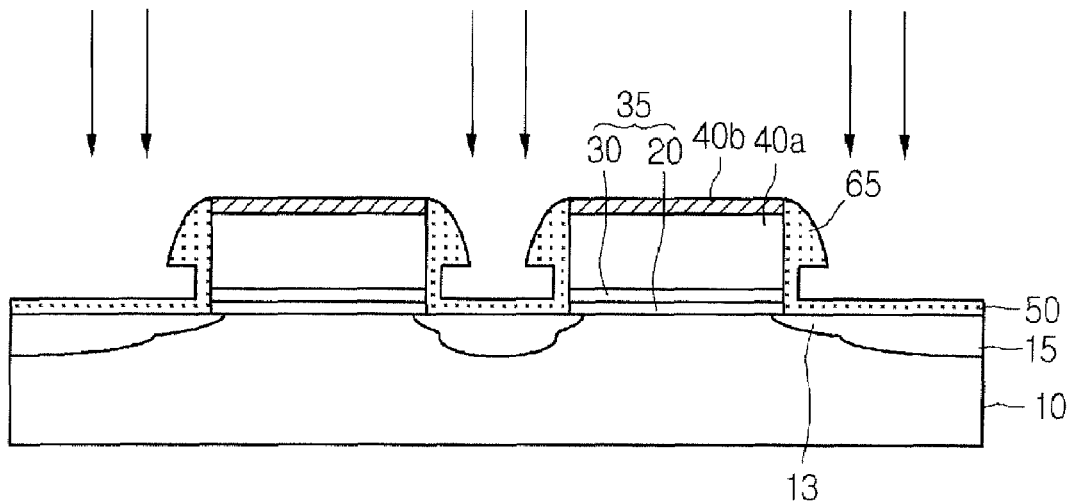

Referring to FIG. 9, unreacted metal layer 67 and the first oxide pattern 60 can be removed through a wet-etching process. In one embodiment, the wet etching process can include using hydrogen fluoride (HF).

Then, using the gate and the spacers 65 as a mask, high-concentration impurities (n-type or p-type impurities) can be ion-implanted to form a source/drain region 15.

A second annealing process can be performed to activate dopants implanted in the source/drain region 15.

Figure 10:
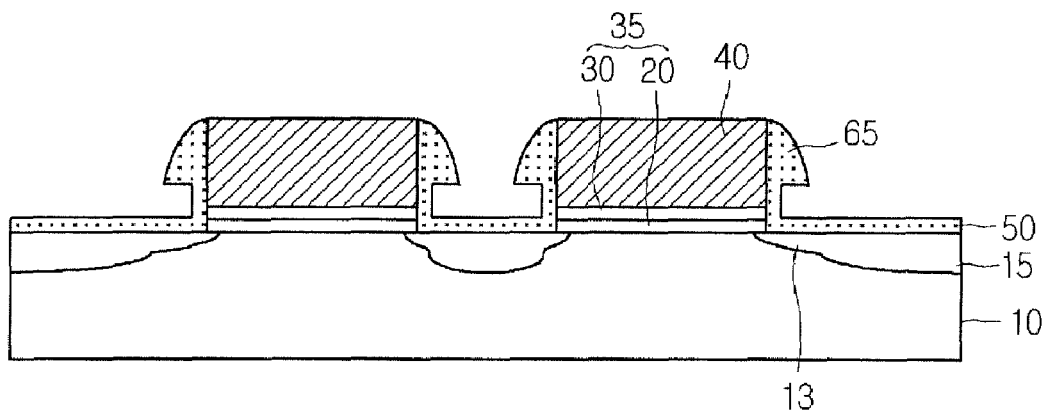

Referring to FIG. 10, the gate electrode 40a can be converted into a FUSI gate electrode 40 during the second annealing process.

As described above, the first annealing process (creating silicide layer 40b) and the second annealing process (completely converting the polysilicon gate electrode 40a) can be used to form the FUSI gate electrode 40, thereby making it possible to further reduce the contact resistance between the device and the interconnection.

Figure 11:
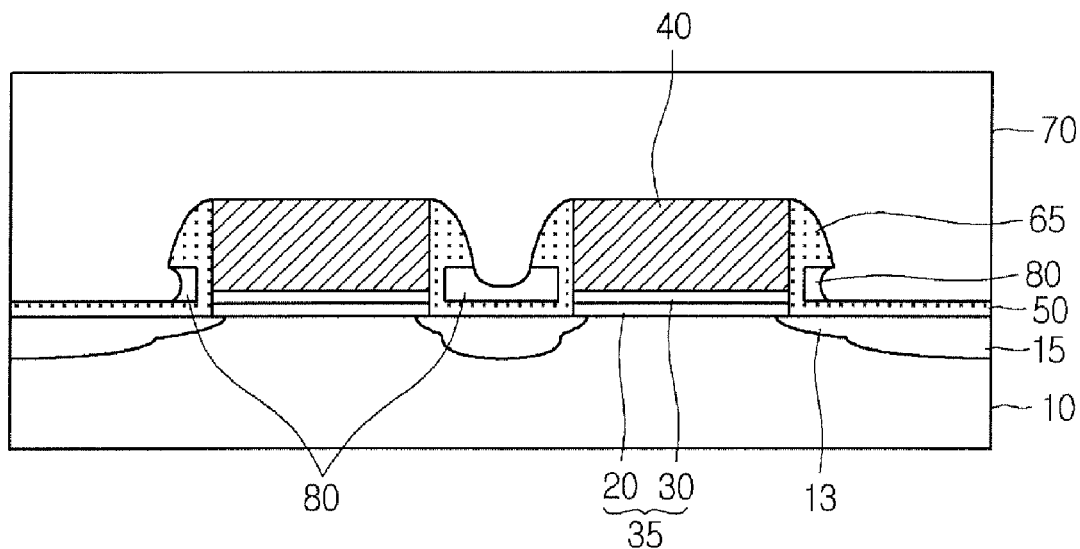

Referring to FIG. 11, a second oxide layer 70 can be formed on the semiconductor substrate 10. The second oxide layer 70 can be formed using, for example, a plasma-enhanced chemical vapor deposition (PECVD) process.

The second oxide layer 70 does not fill in the open space of the spacers 65 created by the removal of the first oxide pattern. Thus, an air gap 80 is formed between the semiconductor substrate 10, the spacers 65, and the second oxide layer 70.

The formation of the air gap 80 greatly reduces the parasitic capacitance of the semiconductor device, thus making it possible to reduce a delay time of the device and to inhibit a decrease in the operation speed.

Referring to FIG. 12, a capping layer 85 can be formed on the second oxide layer 70. The second oxide layer 70 and the capping layer 85 can be selectively etched to form via holes.

The capping layer 85 can be an oxide layer formed, for example, of TEOS (Tetra Ethyl Ortho Silicate)-based oxide or SiH$_4$. The capping layer 85 can be used to protect a device such as the gate formed thereunder.

The via holes can be filled with metal to form contact plugs 75. Although not shown, gate contacts can also be formed.

In certain embodiments, the contact plugs 75 can be formed of tungsten (W).

The semiconductor device fabrication method according to the above-described embodiments can suppress the parasitic capacitance. In addition, embodiments can inhibit a decrease in the operation speed of the device. Further embodiments can include a shallow source/drain region.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modification in the component parts and/or arrangements, alternative uses will also be apparent to those skilled in the art.

What is claimed is:

1. A semiconductor device, comprising: a gate dielectric on a semiconductor substrate: a gate electrode on the gate dielectric; a source/drain region in the semiconductor substrate; a spacer at an upper portion of sidewalls of the gate electrode; an interlayer dielectric on the semiconductor substrate including the gate electrode; an air gap between the spacer, the semiconductor substrate, and the interlayer dielectric; and a nitride layer between the gate electrode and the spacer, wherein the nitride layer extends from the top surface of the gate electrode to the semiconductor substrate such that the nitride layer contacts the gate electrode, the gate dielectric and the spacer.

2. The semiconductor device according to claim 1, wherein the gate dielectric comprises a buffer dielectric and a dielectric layer.

3. The semiconductor device according to claim 2, wherein the buffer dielectric comprises silicon oxide ($SiO_2$).

4. The semiconductor device according to claim 2, wherein the dielectric layer comprises hafnium oxide ($HfO_2$).

5. The semiconductor device according to claim 1, further comprising a lightly doped drain (LDD) region in the semiconductor substrate.

6. The semiconductor device according to claim 1, wherein the nitride layer is further disposed on the source/drain region of the substrate.

7. The semiconductor device according to claim 6, wherein the source/drain region is provided in the semiconductor substrate to a shallow depth.

8. The semiconductor device according to claim 1, wherein the gate electrode comprises nickel silicide.

9. The semiconductor device according to claim 1, wherein the gate electrode is a fully silicided gale electrode.

10. The semiconductor device according to claim 1, wherein the spacer comprises silicon nitride (SiN).

11. The semiconductor device according to claim 1, wherein the air cap is disposed below the spacer at a region corresponding to a lower portion of the gate electrode.

12. A method (hr fabricating a semiconductor device, comprising:
    forming a gate dielectric and a gate electrode on a semiconductor substrate;
    forming a spacer on an upper region of the sidewall of the gate electrode and spaced apart from the semiconductor substrate;
    forming a first nitride layer between the gate electrode and the spacer, wherein the first nitride layer extends from the top surface of the gate electrode to the semiconductor substrate such that the first nitride layer contacts the gate electrode, the gate dielectric and the spacer;
    forming a source and a drain in the semiconductor substrate; and
    forming an interlayer dielectric on the semiconductor substrate such that an air gap is formed between the spacer, the interlayer dielectric and the semiconductor substrate.

13. The method according to claim 12, further comprising forming a lightly-doped drain (LDD) region in the semiconductor substrate.

14. The method according to claim 12, wherein forming the first nitride layer comprises: forming the first nitride layer on the semiconductor substrate after forming the gate dielectric and the gate electrode.

15. The method according to claim 14, wherein forming the source and drain comprises performing a blanket ion implantation process, wherein the source and drain are provided to a shallow depth in the semiconductor substrate after penetrating through the first nitride layer.

16. The method according to claim 12, wherein the forming of the spacer on the upper region of the sidewall of the gate electrode and spaced apart from the semiconductor substrate comprises:
    forming an oxide layer on the semiconductor substrate having the gate dielectric and the gate electrode;
    etching the oxide layer to form an oxide pattern at a lower region of the sidewalls of the gate electrode;
    forming a second nitride layer on the semiconductor substrate having the oxide pattern;
    anisotropically etching the second nitride layer to form a self-aligned spacer on the sidewall of the gate electrode; and
    removing the oxide pattern.

17. The method according to claim 16, further comprising:
    performing a silicide process with respect to the gate electrode by depositing a metal layer on the semiconductor substrate including the oxide pattern and performing a heat treatment process to react the metal layer with the gate electrode, and
    removing unreacted metal layer.

18. The method according to claim 12, wherein the gate dielectric comprises a buffer dielectric formed of silicon oxide ($SiO_2$) and a dielectric layer formed of hafnium oxide ($HfO_2$).

19. The method according to claim 12, wherein the spacer comprises silicon nitride (SiN).

* * * * *